United States Patent
Sui et al.

(10) Patent No.: US 10,031,421 B2
(45) Date of Patent: Jul. 24, 2018

(54) DIRECT NANOLITHOGRAPHY OR PRINTING METHOD FOR ELECTRON BEAMS IN WET ENVIRONMENT

(71) Applicant: BEIJING UNIVERSITY OF TECHNOLOGY, Beijing (CN)

(72) Inventors: Manling Sui, Beijing (CN); Yue Lu, Beijing (CN); Furong Chen, Hsingchu (TW)

(*) Notice: Subject to any disclaimer, the term of this patent is extended or adjusted under 35 U.S.C. 154(b) by 0 days.

(21) Appl. No.: 15/362,811

(22) Filed: Nov. 28, 2016

(65) Prior Publication Data
US 2017/0075234 A1 Mar. 16, 2017

Related U.S. Application Data

(63) Continuation-in-part of application No. PCT/CN2014/088560, filed on Oct. 14, 2014.

(30) Foreign Application Priority Data

Jun. 7, 2014 (CN) .......................... 2014 1 0251013

(51) Int. Cl.
G03F 7/20 (2006.01)

(52) U.S. Cl.
CPC .............. *G03F 7/2059* (2013.01); *G03F 7/20* (2013.01); *G03F 7/70858* (2013.01)

(58) Field of Classification Search
CPC ........ G03F 7/0002; G03F 7/20; G03F 7/2051; G03F 7/165; G03F 7/00; G03F 7/2059; G03F 7/203; G03F 7/70858
See application file for complete search history.

(56) References Cited

FOREIGN PATENT DOCUMENTS

WO   WO 2012099635 A2 * 7/2012 ......... B81C 1/00531

* cited by examiner

Primary Examiner — Michelle M Iacoletti
(74) Attorney, Agent, or Firm — Wayne & King LLC (57) ABSTRACT

A method for nanometre etching or printing using an electron beam in a humid environment, which belongs to the field of electronic exposure. The method comprises: first, attaching a solution, humid atmosphere or humid environment curing layer to the surface of a substrate required to be etched and printed; then placing same in an electron beam exposure device to conduct electron beam exposure, so that a required nanometre micromachining pattern can be etched and printed on the substrate. The humid environment solution used in the method is mostly deionized water, solution containing metal ions, complex or other environment-friendly solutions. In this method, a nanoscale micromachining finished product can be obtained after electron beam exposure without chemical components such as photoresist, etc. required in the traditional electron beam etching or printing process and complicated machining processes such as fixation, rinsing, etching, gold-plating, etc. Moreover, the electron beam exposure rate is fast, the line width of electron beam photoetching or printing is uniform, and the size of the line width is the same as that of the electron beam. Therefore, the production efficiency can be greatly increased, thereby reducing nanoscale micromachining production costs.

4 Claims, 9 Drawing Sheets

DIRECT NANOLITHOGRAPHY OR PRINTING METHOD FOR ELECTRON BEAMS IN WET ENVIRONMENT

CROSS-REFERENCE TO RELATED APPLICATIONS

This application is a continuation in part of International Patent Application No. PCT/CN2014/088560 with a filing date of Oct. 14, 2014, designating the United States, now pending, and further claims priority to Chinese Patent Application No. 201410251013.6 with a filing date of Jun. 7, 2014. The content of the aforementioned applications, including any intervening amendments thereto, are incorporated herein by reference.

TECHNICAL FIELD

The present invention designs a novel nanoscale microstructure electron beam lithography or printing method. The method belongs to the field of electron exposure, which is specifically a method for exposing electron beams in a wet environment, and can be used for manufacturing nanoscale patterns on semiconductor of various patterns.

BACKGROUND OF THE PRESENT INVENTION

With the continuous development of microelectronic technologies and improvement of application market demands, finish machining of nanoscale materials gradually becomes a core foundation of micromachining industry. Due to wavelength constraints of light, increasing demands of people on nanoscale micromachining cannot be met by the traditional photolithography. However, precision of the lithography is mainly affected by scattering of photons on wavelength scale, and therefore, the shorter the wavelength is used, the higher the precision of lithography is got. According to the matter wave theory of de Broglie, electron is a wave with an extreme wavelength, the exposure precision of the electron beams can reach up to a nanometer scale. The electron beam exposure as a novel nanoscale circuit integration and nanometer component processing technology has achieved great progress and realized large-scale production. For example, electron beam lithography and printing devices, such as EBL Raith150 produced by German companies, JBX5500ZA of Japan Electronics, etc. have realized commercialized production. So far, the basic operating steps of electron beam lithography or printing are as follows: a specific solution of electron beam resist is subjected to spin-coating on a semiconductor substrate which needs to be etched; then, the resist is dried to form a layer of solid-state photoresist film; after that, the photoresist film is placed under an electron beam exposure system to exposure patterns which we needed by the devices; then it is taken out and developed in corresponding developing agents, thereby removing exposed resists on the substrate to have the further printed or etched processes; then the substrate is transferred to an etcher or an evaporation coating machine, and the exposed substrate part is subjected to plasma etching or coating treatment; and then the substrate is placed in a specific cleanout fluid, and residual resists on the substrate surface are removed. It is observed from the above operating steps that, technologies needed by traditional electron beam lithography method are very complicated, and the needed devices are extremely expensive. In addition, due to lots of organic solvents such as photoresist, developing solution, cleaning agents, etc. are used during electron beam lithography, environmental pollution is extremely serious, and production efficiency is low. Therefore, up to now, an electron beam exposure technology has not been widely produced and applied in large scale, and all the problems can be solved in urgent need of providing the electron beam exposure technology with advantages of lower cost, less environmental pollution and higher processing efficiency in industrial community.

SUMMARY OF PRESENT INVENTION

Based on the above challenges, the present invention proposes a method for etching or printing nano patterns on a material surface in a wet environment by utilizing electron beam exposure. According to the method, a wet environment layer is attached to the surface of an exposed substrate on the basis of the traditional electron beam exposure system, and includes a pure liquid layer, a vapor layer, and a solid layer containing crystal water or absorbed water, so that nanoscale pattern etching and printing under electron beam exposure can be directly performed on surfaces of various substrate materials including oxides, sulfides, nitride, silicon and silicides, fluoride inorganic semiconductors, insulators as well as halide ion crystals, and organic matters.

A direct nanolithography or printing method for electron beams in a wet environment, successively including the following steps:

Steps:

(1) Manufacturing a Wet Environment Covering Film dropping deionized water, aqueous solution containing inorganic ions or organic complex solution on a substrate, thereby forming a liquid covering film layer with thickness of 1 nm-1 cm on the surface of substrate. In addition, a water vapor layer or a solid layer containing crystal water or absorbed water can also be sealed on the substrate surface, the thickness of this layer needs to be converted into a criterion of water content, and average thickness of the water layer is between 1 nm and 1 cm after conversion.

(2) Performing Electron Beam Exposure directly performing electron beam exposure on the substrate with respect to an electron beam exposure device allowed to be operated in the wet environment;

with respect to an electron beam exposure device which is not allowed to be operated in the wet environment, sealing the wet environment covering film layer first, and exposing the substrate under the electron beams, thereby etching or printing needed nanoscale micromachining patterns;

(3) Cleaning the Substrate cleaning the exposed substrate, and drying the substrate.

Further, a semiconductor material is etched by taking deionized water as the wet environment or by adopting weak acid, base, organic or inorganic salt type wet environment etching agents.

Further, with regard to a printing device, aqueous solution containing metal ions and inorganic salts or a metal organic complex is selected as the wet environment.

Further, nano patterns of electron beam lithography or printing are drawn by moving the electron beams or moving a sample stage.

A wet environment layer exists between an electron beam exposure source and a substrate needing to be etched and printed. The wet environment is pure liquid, a wet environment atmosphere or a wet environment cured layer.

Most of semiconductor materials, such as $VO_2$, $CeO_2$, $ZnO$ and $TiO_2$, can be etched by utilizing the deionized water as the wet environment.

Conventional semiconductors, such as Si and Ge, including metal and insulator devices, can be etched by adopting the weak acid, base, organic or inorganic salt type wet environment etching agents.

Most of printing devices can perform deposition printing of nanoscale metal, metal oxide and inorganic compound patterns on the substrate surface by selecting various aqueous solution containing metal ions and inorganic salts and metal organic complexes as the wet environment.

Nanoprinting patterns of other materials, such as C base and oxide base, can be realized by changing components of the wet environment. For example, a macromolecular organic solution is subjected to electron beam bombardment, so that C-based nano patterns can be formed.

The nano patterns of electron beam lithography or printing are drawn by moving the electron beams, and the electron beams do not limit voltage and current density.

The nano patterns of electron beam lithography or printing can be drawn by moving the sample stage, and the electron beams do not limit voltage and current density.

Line width of patterns etched on the electron beam lithography substrate is the same as the size of the electron beams.

The traditional needed photoresist and resist layer are not needed during electron beam lithography, so that the substrate is directly etched by the electron beams.

Compared with the existing art, the present invention has the following advantages:

1. Environment Friendliness

According to the present invention, the deionized water, an environmental-friendly organic solution or a solution containing metal ions is dropped on the surface of the substrate to serve as an etching agent or printing liquid so as to perform electron beam lithography or printing. The solution system is pollution-free, toxicity-free and environment-degradable in the whole operating process.

In the traditional electron beam lithography or printing technology, an electron beam resist needs to be spin-coated on the substrate surface to dry, while the traditional resists include PMMA, ZEP-520, ma-N 2400, etc. and are all non-degradable organic matters to environment. In addition, developing solutions, such as MIBK, IPA, xylene, MIF726, etc., are needed during developing after electron beam exposure or during final resist removing treatment, and have high toxicity and environmental non-degradability, and therefore, great harm to the environment and a human body are caused.

2. Low Price

In the wet environment electron beam lithography or printing process of the present invention, the substrates can be selected from semiconductor devices or other various inorganic materials for etching, and different etching base material patterns can be realized by changing etching or printing liquid only, rather than the traditional electron beam lithography or printing that a resist layer is spin-coated on the surface of a semiconductor or a base material needed to be etched. Therefore, the technical method of the present invention can greatly reduce processing cost.

3. Simplicity in Process Operating Steps, High Production Efficiency and Low Cost.

According to the wet environment electron beam lithography or printing method in the present invention, the base material can be removed after electron beam exposure, and the surface of the base material is cleaned, so that a finished product can be obtained.

Lots of developing solutions need to be used for cleaning the substrate after electron beam exposure in the traditional electron beam lithography or printing technology, so that the needed nano patterns and excessive resists can be removed. Then the treated substrate is placed in an etching instrument or an evaporation coating instrument for etching or printing. The residual resists and the like on the substrate surface need to be degummed after the operating step, and the substrate surface is repeatedly cleaned, thereby obtaining the needed nanoscale micromachining device. The steps are very complicated.

It is observed by contrast that, the method achieves effects of greatly reducing complicated process needed by the traditional nanometer devices after electron beam exposure, reducing usage of various developing and cleaning solutions in the electron beam lithography or printing process and completely not using various expensive etching and evaporation coating devices, so that production cost can be greatly reduced, production efficiency is improved, and large-scale industrial production is facilitated.

4. High Electron Beam Exposure Rate

According to the wet environment electron beam lithography or printing method in the present invention, needed time of etching a substrate sample of 10 nm thick is less than 1s, and needed time of printing patterns of 10 nm on the substrate is within 1s.

5. Capacity of being Exposed by Using a Traditional Electron Beam Exposure System In the operating process, density of the used electron beams is 0.1 $e^- \cdot A^{-2} \cdot s^{-1}$ to 5000 $e^- \cdot A^{-2} \cdot s^{-1}$, voltage can be modulated according to experiment conditions, and range of the voltage is between 1 eV and 1 MeV. The conditions are almost consistent with voltage beam requirements of electron beams needed by the traditional electron beam exposure, and therefore, the method can perform electron beam exposure by utilizing the existing traditional electron beam exposure system.

In conclusion, the traditional nanoscale electron beam micromachining method is changed in the present invention, pollution sources in the nanoscale electron beam micromachining process can be reduced, production cost of micromachining is reduced, and nano electron beam micromachining production efficiency is improved, so that wide application of an electron beam exposure technology and large-scale industrial production of nanoscale micromachining industry can be promoted.

DETAILED DESCRIPTION OF PREFERRED EMBODIMENTS

The present invention is implemented by the following technical solutions, including the following specific steps:

First Step, Cleaning a Substrate the surface of the substrate needs to be decontaminated before micromachining; the operation herein is the same as a traditional micromachining operation method, that is, the surface of the substrate is decontaminated by surface cleaning solution.

Second Step, Forming Suspension a wet environment layer is attached to the surface of the cleaned substrate, and components of a wet environment are determined by the wet environment layer according to the material of the micromachining substrate and materials of patterns needing to be micro-machined on the substrate surface. For example, a deionized water layer is attached to $VO_2$, and the water is subjected to electron beam bombardment so as to cause nanoscale etching of $VO_2$. In addition, the wet environment layer can be further replaced with an acid and alkaline solution, a neutral ion solution, a vapor atmosphere and solids containing crystal water or absorbed water; organic solution containing metal ions, aqueous solution and solids containing the crystal water can be selected if a metal layer or a metal oxide pattern is expected to be printed on the surface; and the wet environment can be replaced with organic matter solution, vapor and water-containing organic complexes if organic matters and a carbon layer are etched and printed on the surface.

Third Step, Sealing

Interior of a traditional electron beam exposure device is designed as vacuum (air pressure is less than 1 atm), and therefore, the substrate in the wet environment needs to be subjected to vacuum seal treatment, so that the interior of the electron beam exposure device is kept vacuum. With respect to an electron beam exposure device without specific vacuum protection, a sealing step can be omitted.

Fourth Step, Performing Electron Beam Exposure

The substrate attached with the wet environment layer is placed under electron beams for performing nano-beam exposure, thereby etching or printing the needed nano-scale micromachining patterns.

Fifth Step, Cleaning the Surface of the Substrate the machined substrate is cleaned by using cleaning solution, that is, a substrate with nanoscale etched or printed patterns can be obtained.

Some embodiments are implemented below with respect to the present invention, and are detailed implementation solutions and descriptions of specific operating processes on premise of the technical solution of the present invention. However, the protection scope of the present invention includes but not limited to the following embodiments.

Embodiment 1

A $VO_2$ film with thickness of 20 nm is coated on a $Si_3N_4$ film layer (with thickness of 20 nm) by using magnetron sputtering (selection of the $Si_3N_4$ film is not for any special purpose in all of the following embodiments, but is only designed for convenient seal in subsequent process).

The $VO_2$ film is subjected to hydrophilic treatment, gas used by sample treatment is a mixed gas of argon and oxygen, a gas ratio is 4:1 (gas pressure does not have any influence on subsequent treatment), and treatment time is 30 s.

A drop of deionized water is dropped on the surface of the $VO_2$ sample subjected to hydrophilic treatment, and is spin-coated to spread on the sample surface, thereby forming a water film layer with thickness of 200 nm.

Another $Si_3N_4$ film with thickness of 20 nm is selected to be placed on the water layer, and the water layer and the upper and lower layers of $Si_3N_4$ films are sealed by using vacuum sealing grease.

Figure 1:
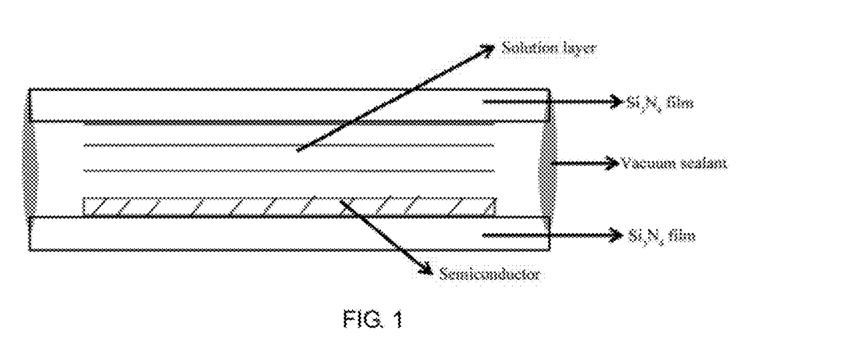
FIG. 1 is a schematic diagram illustrating a film and base material sealing device.
Figure 2:
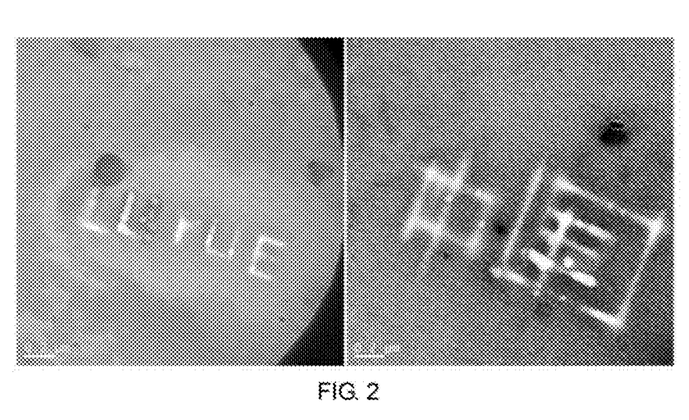
FIG. 2 is a TEM photo illustrating patterns etched on a $VO_2$ film after electron beam exposure.
Figure 3:
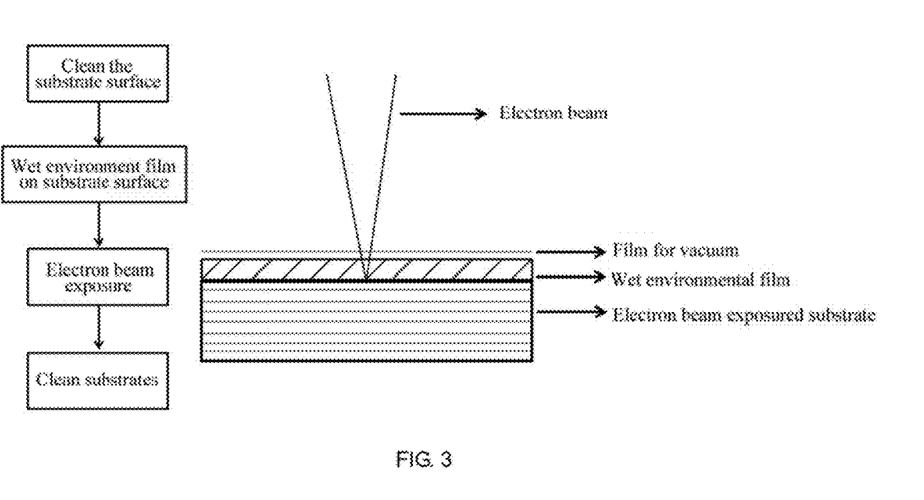
FIG. 3 is a process flow chart of the preparation method and a schematic diagram of a method principle.
Figure 4:
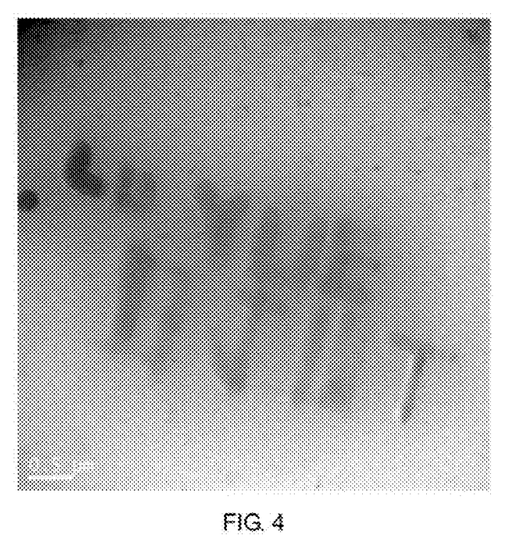
FIG. 4 is a TEM photo illustrating patterns printed on a $VO_2$ film after electron beam exposure.

The sealed sample is placed on a TEM (transmission electron microscope) sample holder and then placed in TEM (voltage is 200 keV, and the selected electron beam density is $1\ e^-\cdot A^{-2}\cdot s^{-1}$), the electron beams converge into spots with a diameter of 35 nm, and the spots inch at a speed of 30 nm per second along patterns needing to be etched by regulating buttons shift X and Y of the TEM, so that the needed patterns are etched on the $VO_2$ substrate, as shown in FIG. 2 and FIG. 4. An electron beam exposure position relationship among the deionized water layer, the $VO_2$ film layer and the $Si_3N_4$ film layer in the whole etching process is shown in the schematic diagram 1. In FIGS. 1 and 3, the thickness of the electron beam exposed substrate is increased in the above embodiment, which indicates applicability to preparation of large thick sample devices. In addition, the above liquid layer is marked as the wet environment layer, and the $Si_3N_4$ film is marked as a mask.

After the nano patterns are completely etched, the sample is taken out, the sealing device is uncovered, and the $VO_2$ film is cleaned, put into a drying oven to be heated to 80° C. in vacuum and then taken out after 10 minutes.

Embodiment 2

A $Si_3N_4$ film with thickness of 20 nm is selected to be subjected to hydrophilic treatment, gas used by sample treatment is the mixed gas of argon and oxygen, the gas ratio is 4:1, and the treatment time is 30 s.

A drop of vaseline alcohol solution with a proportion of 0.1 g/cm$^3$ is dropped on the $Si_3N_4$ film subjected to hydrophilic treatment, and is spin-coatedon the $Si_3N_4$ film, thereby forming a solution film with thickness of 200 nm.

Then another $Si_3N_4$ amorphous film with thickness of 20 nm is selected to be placed on the solution film layer, and the sample device is sealed by using vacuum sealing grease, as shown in FIG. 3 in the solution I.

The sealed sample is placed on the TEM (transmission electron microscope) sample holder and then placed in TEM (voltage is 200 keV, and the selected electron beam density is $1\ e^-\cdot A^{-2}\cdot s^{-1}$), the electron beams are opened, electron beam spots converge into electron beam spots with the diameter of 35 nm, and the spots move at a speed of 30 nm per second so as to draw the needed patterns by rotating buttons shift X and Y of the TEM, so that the needed patterns can be printed on the $VO_2$ film which is subjected to hydrophilic treatment, as shown in FIGS. 2 and 4.

After the nano patterns are completely etched, the sample is taken out, the sealing device is uncovered, and the $VO_2$ film is cleaned, put into the drying oven to be heated to 80° C. in vacuum and then taken out after 10 minutes.

Embodiment 3

The $VO_2$ film in the embodiment 1 is replaced with materials such as ZnO, $Fe_2O_3$, $MnO_2$, $CeO_2$, $Co_3O_4$, CuO, $TiO_2$, $SnO_2$, MgO, $Al_2O_3$ and $Fe_3O_4$.

Each film is subjected to hydrophilic treatment, gas used by sample treatment is the mixed gas of argon and oxygen, the gas ratio is 4:1 (gas pressure does not have any influence on the subsequent treatment), and the treatment time is 30 s.

A drop of deionized water is dropped on the surface of each sample subjected to hydrophilic treatment, and is spin-coated to spread on the sample surface, thereby forming a water film layer with thickness of 200 nm.

Another $Si_3N_4$ film with thickness of about 20 nm is selected to be placed on the water layer, the water layer and the upper and lower layers of $Si_3N_4$ films are sealed by using vacuum sealing grease, and the packaged sample is as shown in FIG. 3.

The sealed sample is placed on the TEM (transmission electron microscope) sample holder and then placed in the TEM (voltage is 200 keV, and the selected electron beam density is 1 $e^-\cdot A^{-2}\cdot s^{-1}$), the electron beams are opened, and electron beam spots converge into electron beam spots with the diameter of about 35 nm.

Figure 5:
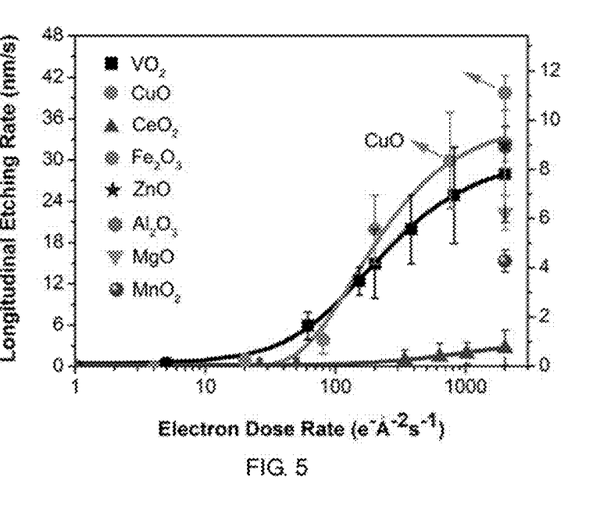
FIG. 5 is a dissolution rate of different materials as a change of electron beam dose rate.

The dissolution rate of materials is calculated by the methods that we use the needed time of each film material to be penetrated to be divided by the thickness of samples, as shown in FIG. 5.

Embodiment 4

According to lots of experimental comparison results in the above embodiment 3, thicknesses of other different semiconductor films, such as fluorides, nitrides, silicides, etc., can be deduced to be 20 nm according to experimental theories, exposure is performed in electron beams with the voltage of 200 keV and beam density of 1 $e^-\cdot A^{-2}\cdot s^{-1}$, the wet environment layer is a deionized water layer and has the thickness of 200 nm, the convergent electron beams have the diameter of 35 nm under experimental conditions, etching is performed as shown in embodiment 3, and the etching rate is as shown in FIG. 5.

It should be noted that, crystal orientation, flatness and surface defect percentage of different films are completely consistent is assumed in calculation, and therefore, the above parameters do not serve as calculation factors in calculation.

Embodiment 5

Various metal oxide films with thickness of 20 nm are coated on the $Si_3N_4$ film layer with the thickness of 20 nm by using magnetron sputtering.

The metal oxide films are subjected to hydrophilic treatment, gas used by sample treatment is the mixed gas of argon and oxygen, the gas ratio of the oxygen to argon is 4:1, and the treatment time is 30 s.

A drop of 0.2 g/ml saline solution is dropped on the metal oxide films subjected to hydrophilic treatment, and spreads out on the sample surface, thereby forming a saline solution film with thickness of 200 nm.

A $Si_3N_4$ film with thickness of 20 nm is selected to be placed on the saline solution layer, the water layer and the upper and lower layers of $Si_3N_4$ films are sealed by using vacuum sealing grease, and the packaged sample is shown in FIG. 3.

The sealed sample is placed on the TEM (transmission electron microscope) sample holder and then placed in the TEM, the voltage is 200 keV, and beam density of the electron beams is changed into 0-1500 $e^-\cdot A^{-2}\cdot s^{-1}$. Dissolution rate for different materials is recorded under different beam dose rate, as shown in FIG. 5.

It is observed that, an optimal beam density of about 400-1000 $e^-\cdot A^{-2}\cdot s^{-1}$ exists in the etching process. The higher the beam density is, the higher the energy consumption is; the lower the beam density is, the lower the etching rate is. The etching time needs to be increased (the used electron energy above is 200 keV).

Embodiment 6

Figure 6:
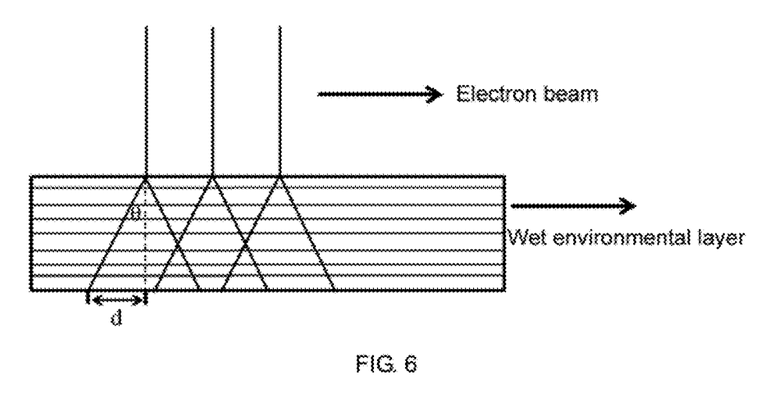
FIG. 6 is a schematic diagram illustrating spread of the electron beam spot due to the scattering, which will induce a reduction for the precision of the electron beam lithography.

According to lots of experimental comparison results in the above embodiment 2 and with the adoption of the experimental conditions in the embodiment 2, consumed time of printing microstructure patterns of 20 nm thick is measured by changing different beam dose rate, the selected electron energy herein is 200 keV, the electron beam spots have the diameter of 35 nm, and the result is shown in FIG. 6.

Note: the experimental result herein shows that the optimal printing electron beam density needs to be selected according to different materials needing to be printed.

Embodiment 7

Figure 7:
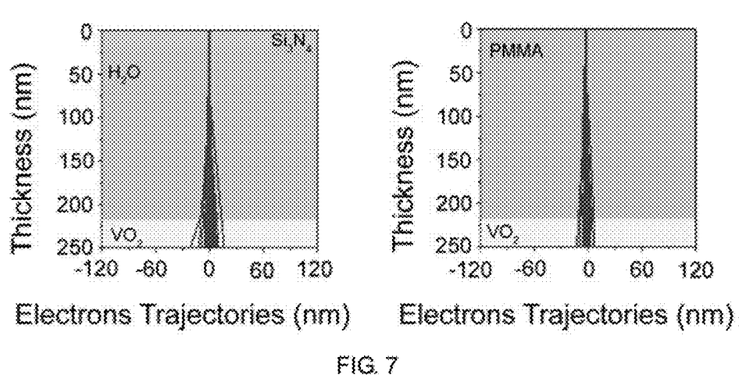
FIG. 7 is the simulated results to show the electron trajectories induced by the interaction between electron beam and water or PMMA.
Figure 8:
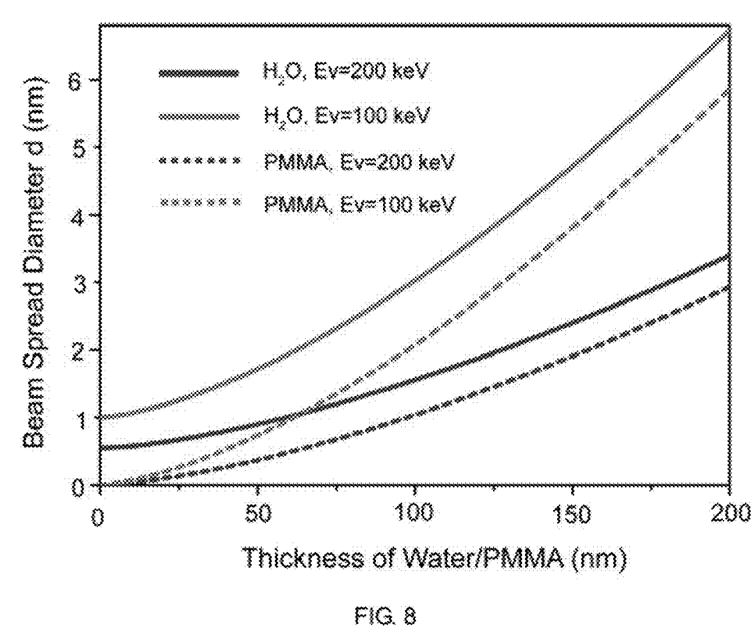
FIG. 8 is the beam spot spread diameter as a change of water/PMMA thicknesses at different electron voltage.

Because the electron beams are scattered in the materials and the same as in liquid, as shown in the schematic diagram in FIGS. 6 and 7, deionized water and PMMA are selected as a wet environment solvent or traditional resist for performing simulated calculation; the voltage of the electron beams here we simulated is changed between 100 and 200 keV; the beam density is 1 $e^-\cdot A^{-2}\cdot s^{-1}$; liquid is the deionized water; liquid thickness is 200 nm; and beam spot size is 10 nm, so that a relation between beam spread diameter is calculated as a change of water/PMMA thickness as shown in FIG. 8. The larger the scattering is, the wider the nano patterns are in the etching or printing process.

Note: the calculation is applicable to printing in other types of wet environments (all liquid wet environments, vapor wet environments and solid wet environments).

Embodiment 8

Under the experimental conditions that the electron beam voltage is 200 keV, the beam density is $e^-\cdot A^{-2}\cdot s^{-1}$, the electron beam spot size is 35 nm and the liquid is the deionized water, thicknesses of different solutions are calculated and simulated, so that the influence on beam spot spreading size can be obtained, as shown in FIG. 8.

Embodiment 9

Figure 9:
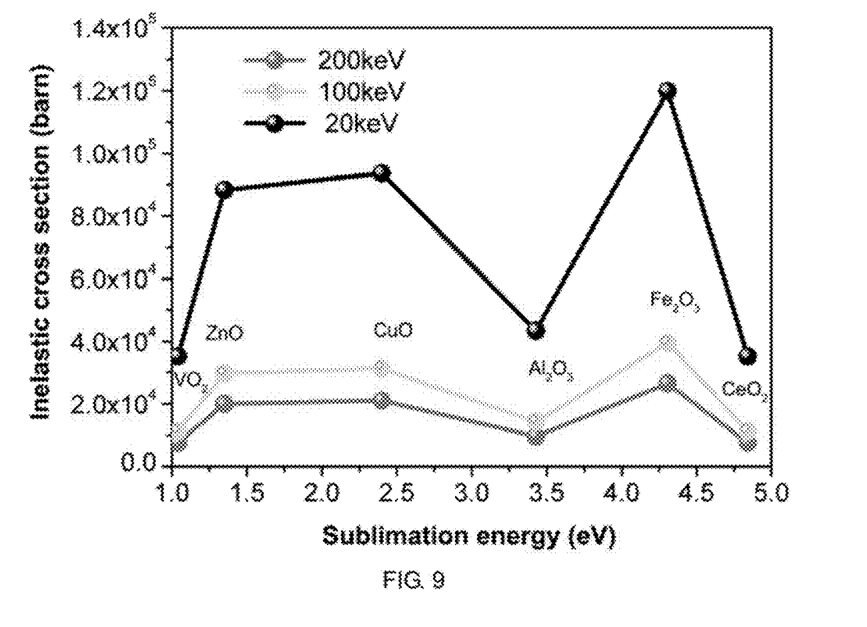
FIG. 9 is the inelastic scattering cross section as a change of the sublimation energy for different materials.

The wet environment layer in the above embodiments is a pure liquid layer, while with respect to the vapor layer and solid layer containing the crystal water or absorbed water and organic matters, etching or printing parameters are related to content of the organic matters or water, that is, the parameters can be calculated by converting into thickness of pure liquid water. As shown in FIG. 9, the inelastic cross section show the etching ability of materials as a change of its sublimation energy, the value for cross section is much higher, the etching ability is greater. Here we simulated the cross section of materials at different electron beam voltage as shown in FIG. 9, from which we can see that low electron beam voltage can help us to get a high value of cross section. It means that it is with good superiority to apply for low electron beam voltage in this invention.

Embodiment 10

During electron beam lithography with the voltage of 200 kV, because stopping power of the electron beams in water is 2.798 MeVcm$^2$/g, maximum penetration depth of the electron beams converted into 200 keV in water is lower than 1 cm. The penetration depth in other liquid is almost similar to that in water, and therefore, liquid thickness of the electron beams of 200 keV must be less than 1 cm.

Essence of electron beam lithography and printing method in the wet environment is that the liquid layer reacts with the substrate under electron beam excitation, so the thickness of the liquid layer cannot be lower than 1 nm (it is an extreme molecular thin-layer thickness, which represents a thickness close to two water molecule layers).

We claim:

1. A direct nanolithography or printing method for electron beams in a wet environment, successively comprising the following steps: (1) manufacturing a wet environment covering film, namely dropping deionized water, aqueous solution containing inorganic ions or organic complex solution on a substrate surface to form a liquid covering film layer with thickness of 1 nm-1 cm on the substrate surface; or sealing a water vapor layer or a solid layer containing crystal water or absorbed water on the substrate surface, wherein the thickness of the layer is converted into liquid water, and average thickness of the water layer is between 1 nm and 1 cm after conversion; (2) performing electron beam exposure, namely performing electron beam exposure on the substrate with respect to an electron beam exposure device operable in the wet environment; or sealing the wet environment covering film layer first, and exposing the substrate under the electron beams with respect to an electron beam exposure inoperable in wet environment, to etch or print needed nanoscale micromachining patterns; and (3) cleaning the substrate, namely cleaning the exposed substrate, and drying the substrate.

2. The direct nanolithography or printing method for electron beams in the wet environment according to claim 1, wherein the substrate is subjected to electron beam exposure lithography or printing with respect to a semiconductor material by taking deionized water, weak acid, base, organic complex or inorganic salt type aqueous solution as a wet environment layer.

3. The direct nanolithography or printing method for electron beams in the wet environment according to claim 1, wherein the substrate of electron beam exposure lithography and printing is made of oxides, sulfides, nitride, silicon and silicides, fluoride inorganic semiconductors, insulators, halide ion crystals, metals or organic matters.

4. The direct nanolithography or printing method for electron beams in the wet environment according to claim 1, wherein nano patterns of electron beam lithography or printing are drawn by moving the electron beams or moving a sample stage.

* * * * *